United States Patent [19]

Marczewski et al.

[11] Patent Number: 4,755,775
[45] Date of Patent: Jul. 5, 1988

[54] MICROWAVE BALUN FOR MIXERS AND MODULATORS

[75] Inventors: Wojciech Marczewski; Waclaw Niemyjski, both of Warsaw, Poland

[73] Assignee: Polska Akademia Nauk Centrum Badan Kosmicznych, Warsaw, Poland

[21] Appl. No.: 677,847

[22] Filed: Dec. 4, 1984

[30] Foreign Application Priority Data

Dec. 9, 1983 [PL] Poland ................................. 245000

[51] Int. Cl.$^4$ ............................................. H01P 5/10
[52] U.S. Cl. .................................... 333/26; 455/326; 455/327
[58] Field of Search ............................ 333/26, 35, 32; 455/326, 327, 330, 332, 325; 343/859, 863, 821

[56] References Cited

U.S. PATENT DOCUMENTS

| | | | |
|---|---|---|---|
| 2,597,853 | 5/1952 | Coleman | 333/35 |
| 2,606,964 | 8/1952 | Gluyas, Jr. | 333/26 |
| 3,222,621 | 12/1965 | Yoshida | 333/26 |
| 3,497,832 | 2/1970 | Cohn | 333/26 |
| 3,656,071 | 4/1972 | Woodward | 333/26 |
| 3,757,342 | 9/1983 | Jasik et al. | 343/738 |
| 3,818,385 | 6/1974 | Mouw | 333/26 |
| 3,991,390 | 11/1976 | Conrosj | 333/26 |
| 4,032,850 | 6/1977 | Hill | 333/26 X |
| 4,119,914 | 10/1978 | Duncan | 455/326 |
| 4,186,352 | 1/1980 | Hallford | 455/327 |
| 4,193,048 | 3/1980 | Nyhus | 333/26 |
| 4,211,986 | 7/1980 | Tajima | 333/116 |
| 4,245,356 | 1/1981 | Hallford | 455/327 |
| 4,260,963 | 4/1981 | Prapac | 333/26 |
| 4,276,521 | 6/1981 | Davidheiser | 332/23 R |
| 4,288,759 | 9/1981 | Stover | 333/24 R |
| 4,288,762 | 9/1981 | Laughlin | 333/117 |
| 4,330,868 | 5/1982 | Hallford | 455/327 |
| 4,359,782 | 11/1982 | Hallford | 455/327 |
| 4,361,818 | 11/1982 | Otremba | 333/26 |
| 4,371,982 | 2/1983 | Halfford | 455/327 |
| 4,375,699 | 3/1983 | Hallford | 455/327 |
| 4,380,831 | 4/1983 | Hallford | 455/327 |
| 4,392,250 | 7/1983 | Hallford | 455/327 |
| 4,392,251 | 7/1983 | Hallford | 455/327 |
| 4,399,562 | 8/1983 | Hallford | 455/327 |

OTHER PUBLICATIONS

Cloete J. H., "Exact Design of the Marchand Balun"; *Microwave Journal;* May 1980, pp. 99–102.
Cloete J. H., "Graphs of Circuit Elements for the Marchand Balun"; *Microwave Journal,* May 1981, pp. 125–128.
Hallford, B. R.; "Investigation of a Single Sideband Mixer Anomaly" *IEEE Transaction on Microwave Theory/Techniques;* vol. M7731, No. 12, 12/1983, pp. 1030–1038.
Hallford, B. R., "A Designer's Guide to Planar Mixer Baluns"; *Microwave,* vol. 18, No. 12; 12/1979, pp. 52–57.
Laughlin, G. J. "A Wide Impedance Match Wide Band Balun and Magic Tee"; *IEEE Transaction of Microwave Theory/Technique;* vol. MTT24, No. 3, 3/1976, pp. 135–141.

(List continued on next page.)

*Primary Examiner*—Eugene R. LaRoche
*Assistant Examiner*—Benny Lee
*Attorney, Agent, or Firm*—Ladas & Parry

[57] ABSTRACT

A microwave balun using microstrip broadside coupled lines is disclosed for achieving a broadband double balanced mixer or modulator performance. The use of a double layered structure for broadside coupled microstrip lines, called overlapped microstrip lines, makes a balun design equivalent to well known double coaxial Marchand design. It is feasible by means of thin film and MMICs technology. The most advantageous applications of the balun include its simple and inverted options useful for mixer or modulator design considering both the balun and semiconductor junctions manufactured in one compact volume of the lower substrate. A balun circuit layout is one-sided fixed to a contiguous ground plane without using slots or holes in it and othersided open from a top side. The application is dedicated to an approximate frequency range of at least 1 to 18 GHz.

9 Claims, 6 Drawing Sheets

OTHER PUBLICATIONS

Marchand, N., "Transmission Line Conversion"; *Electronics,* vol. 17, 1944, pp. 142–145.

Hammerstad et al., "Accurate Models for Microstrip C.A.D.", *Proceedings of IEEE MTT-S,* Wash. D.C., 1980, pp. 407–409.

Sawicki et al., "Lower/Upper Bound Calculations on Capacitance of Multiconductor Printed Transline Using Spectral-Domain Approach and Variational Method", *IEEE Tr. on MTT,* vol. 34, No. 2, Feb. 1986, pp. 236–244.

T. Kitazawa et al., "Asymmetrical Three Line Coupled Striplines with Anisotropic Substrates" *IEEE Tr. on MTT,* vol. 34, No. 7, Jul. 1986, pp. 767–772.

Venkataraman et al., "Anal. Arbitrary Oriented Microstrip TransLines in Arbitrarily Shaped Dielectric Media Over Finite Ground Plane", *IEEE Tr. MTT,* vol. 133, No. 10, Oct. 1985.

Marques et al., "Propagation of Quasi-Static Modes in Anisotropic TransLines: Application to MIC Lines" *IEEE Tr. MTT,* vol. 33, No. 10, Oct. 1985, pp. 927–932.

Medina et al., "Determination of Green's Function Matrix for Multiconductor and Anisotropic Multidielectric Planar TransLines", *IEEE Tr. MTT,* vol. 33, Oct. 1985, pp. 933–940.

Tripathi, "Asymmetric Coupled TransLines in an Inhomogeneous Medium", *IEEE Trans on MTT,* vol. 23, No. 9, Sep. 1975, pp. 734–739.

Speciale, "Even-and Odd-Mode Waves for Nonsymmetrical Coupled Lines in Nonhomogeneous Media", *IEEE Tr. on MTT,* vol. 23, No. 11, Nov. 1975, pp. 897–907.

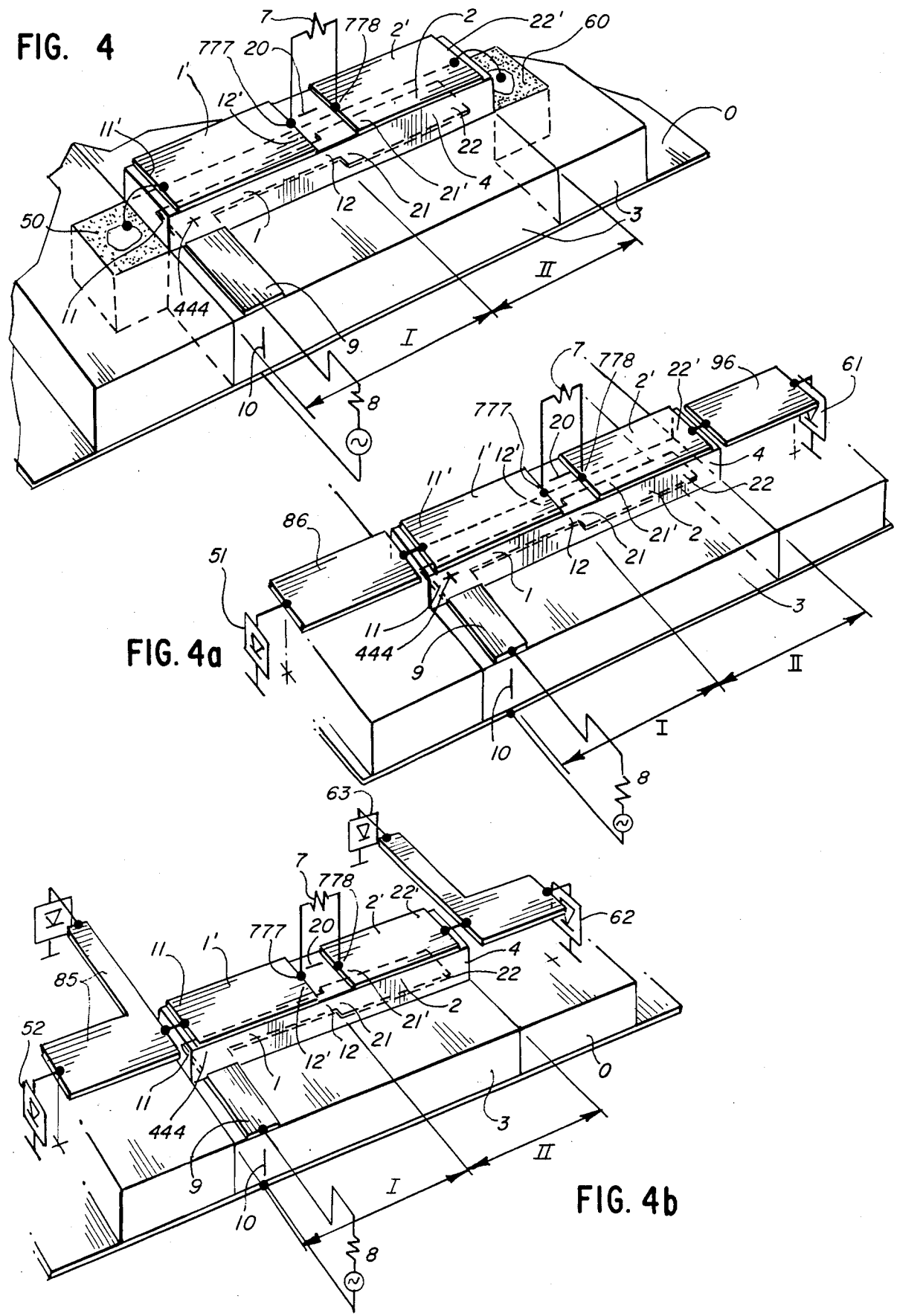

MICROWAVE BALUN FOR MIXERS AND MODULATORS

BACKGROUND OF THE INVENTION

The subject of the invention is a microwave balun for mixers and modulators using TEM wave guides in microstrip realisation.

The balun is an electrical circuit device transmitting radio frequency (RF) signal from an unbalanced input to a balanced output with minimum loses, whereby a broad transmission band and a high impedance transformation ratio are desirable as much as possible. The balun can be applied not only for a balanced load but also for a balanced pair of unbalanced outputs on which RF signals have equal amplitudes but opposite phases.

The balun is a unit which is an integral part of microwave balanced systems such as mixers, modulators, attenuators, switches and others, or a self-contained unit supplying RF signal to balanced loads or inputs or outputs of balanced systems. The mentioned types of systems are very often produced using microstrip lines technique which enables integration thereof in the form of hybrid- or monolithic integrated circuits. This is the consequence of the property of microstrip lines which consists in concentrating the field of electromagnetic wave in the volume under the surface of the strip at a considerable shortening of wavelength in the dielectric substrate and in maintaining planarity of the structure with an easy access to the top surface of the circuit for hybrid attached elements, while the bottom side is fixed as a ground plane. Therefore, it is desirable that the postulate of the microstrip type structure of the circuit should be maintained as close as possible.

From among the hitherto applied baluns two should be distinguished, whereof one is the widely known Marchand's balun, and the other one is the Mouw's balun according to the U.S. Pat. No. 3,818,385. The Marchand's balun consists of two sections. Each section is composed of two coaxial lines, whereof one is placed coaxially in the other. Both sections are connected with each other by conductors between the external coaxial lines. The internal lines are established by two quarter-wave sections of the inner coaxial lines, whereby their internal conductors are connected with each other in the middle and inside of the balun and one of their ends is connected to the input external coaxial line, while the other end remains open to the ground. The internal ends of the external conductors of the said lines are connected to the balanced external output line leading to the balanced load outside the circuit, while their external ends are short-circuited to the ground. The Marchand's balun excellently meets functional requirements both with respect to being broadband and to impedance transformation ratio properties. Its transmission band can exceed even three octaves at loads selected from the range of from 50 Ohm up to 200 Ohm. It is one of the oldest microwave circuits of this type and is still being applied and permanenlty improved. It is widely applied for feeding the broadband symmetric antennas. It is, however, inapplicable in the balanced systems mentioned previously for the reason of its coaxial type structure and relatively large dimensions, especially if the cross-section is considered. The application thereof compels the use of coaxial type wave guides for systems directly co-operating therewith, which is not always acceptable, and certainly inconsistent with the demand of integration of systems.

The Mouw's balun, improved by Hallford and described in the article "A Designer's Guide to Planar Mixer Balun" published in Microwaves December 1979 pp. 52-57, is a relatively recent design. It consists of three conductive striplines, whereof one—the input one, is formed on the top side of the dielectric substrate, and the other two—the output ones—placed thereunder, are formed on the bottom side of the substrate. The external ends of the output lines are short-circuited to the ground which is established by contiguous metallization plane on the bottom side of the substrate. The Mouw's balun has more applications in balanced systems than the Marchand's balun design. It partially meets the planarity requirement, due to what it is somewhat closer to the microstrip type structure. Although its broadband and transformation properties do not come up to those of the Merchand's design, they are sufficiently good for the needs of designing broadband performance systems exceeding one octave.

The drawback thereof is, however, the necessity of using the lines on both sides of the substrate, whereby the system cannot be at one side fixed to the ground. Since Mouw's design can offer a limited choice of the cross-section dimensions, and in consequence thereof, obtaining the desired performance, it can be applied only for few selected types of balanced systems.

Among other examples not mentioned above, there is a rat race hydrid coupler called also a 180° hydrid, which meets the requirement of both microstrip type structure and the equal division of RF signal into two outpus in opposite phases but its frequency band achieves only 20–30% of the mid-band frequency, and the possibilities of its matching in a wide impedance range are small. Moreover, it has the drawback of inconvenient arrangement of output ports, which hinders using thereof to one balanced load, and its applications are limited to a balanced pair of unbalanced outputs.

The above-discussed examples do not exhaust the existing types of realisation of balun designs but show the already disclosed trend to differentiate considerably the used wave guides from the desired microstrip type, e.g. not only by using coaxial lines but also coplanar-lines, or suspended-lines, or slot-lines, or fin-lines. Realisations of balanced˙systems in these techniques are plentiful but require forming the system either on both sides of the substrate or on one side thereof, nevertheless, they are always characterized by impossibility of one side bottom fixing the circuit to the ground because the volume beyond the dielectric substrate on both sides thereof and limited by the housing, is an integral part of the wave guide. Such systems are of a big practical importance for structures combined with the waveguide technique but they are not suitable for use in integrated circuits.

SUMMARY OF THE INVENTION

The aim of the invention is to increase the integration scale of the microwave integrated circuit.

The microwave balun design according to the invention consists of two second-order reactance sections of electrical lengths equal to about a quarter of the wavelength of a radio-frequency signal. Each section comprises two microstrip-like wave guides placed in such a way above the ground plane being the bottom metallization of the lower layered substrate that one of the guides is on the top side of the lower substrate and the other guide, placed thereabove, is separated therefrom by the material of the upper layered substrate and is on the top side of the upper substrate.

The pair of guides, any one from each section, being the pair of input guides, is connected with each other by two ends, and one of the remaining ends thereof is connected to the input, while the other end is terminated for the radio-frequency signal by a reflecting element.

The second pair of the remaining wave guides, being the pair of output guides, forms with its ends, one from each section, a pair of output-port terminals, while each of the remaining ends of the pair of output guides is terminated for the radio-frequency signal by a reflecting element. Phases of reflecting elements terminating the ends of output guides are dependent on the configuration choice of input- and output-ports and on the phase choice of the reflecting element terminating the end of input guides, the opposite to the input-port of the balun.

The cross-section dimensions, in general are different for each section and different for particular segments of each section, and material constants of the used materials have the values dependent on the required broadband properties according to the set of transmission-reflection parameters of the balun design and the required input- and output-impedance.

The terminals of the balanced output-port of the balun are loaded with a balanced load connected either directly or through the intermediary of a balanced transmission line, preferably as short as possible. Eventually, the terminals of the balanced output-port are loaded with a pair of unbalanced loads connected either directly or through the intermediary of unbalanced transmission lines, preferably as short as possible.

In still another solution the terminals of the balanced output-port are loaded with electronically controlled elements or assembly of elements, connected either directly or through the intermediary of transmission lines, preferably as short as possible.

On the other hand, in the monolithic realisation of this solution at least a part of a segment of any of the wave guides in the balun is enhanced either by lumped or by distributed semiconductor junctions.

Reflecting elements in the balun according to the invention are either electronically controlled elements or unbalanced inputs of external reflecting systems connected directly or through the intermediary of transmission lines.

The terminals of the balanced output-port of the balun are eventually loaded with a balanced output port of another balun design. The said load is connected directly or through the intermediary of electronically controlled elements or assembly of elements and/or through the intermediary of transmission lines, preferably as short as possible, thus forming systems of an in-series-, cross- or ring structure.

The balun design according to the invention shows a number of advantages. Namely, it precisely meets the postulate of a planar microstrip-like type structure. It meets the requirements of broadband performance up to three octaves inclusive at a wide range of impedance transformation ratio. Moreover, it has topologically advantageous location of output-port terminals, which enables simple application both for a lumped balanced load and for a balanced pair of unbalanced output ports. It enables also complementary realisation by replacing the short-circuited to ground ends by open ended ones, and open ones by short-circuited ones, what is of significance for co-operation with different application systems. It is a geometrically compact and area saving design, due to which it minimizes the values of parasitic reactance elements.

The presented balun design is especially convenient for production both with the use of thin-film and monolithic technology, and moreover, it has relatively small dimensions and occupies small area, which creates new possibilities of considerably good integration scale of complex balanced microwave systems, especially mixers and modulators.

BRIEF DESCRIPTION OF THE DRAWING

FIG. 4 The balun directly loaded with a lumped balanced load within reflective elements established by electronically controlled devices directly implanted in the lower substrate volume.

FIG. 4a The balun embodiment where reflective elements are electronically controlled devices connected by strip conductive means to balanced output lines for the purpose of modelling their frequency response.

FIG. 4b The balun embodiment where frequency responses of reflective elements are modelled in circuitries containing more than one electronically controlled device.

DESCRIPTION OF PREFERRED EMBODIMENTS

Figure 1:
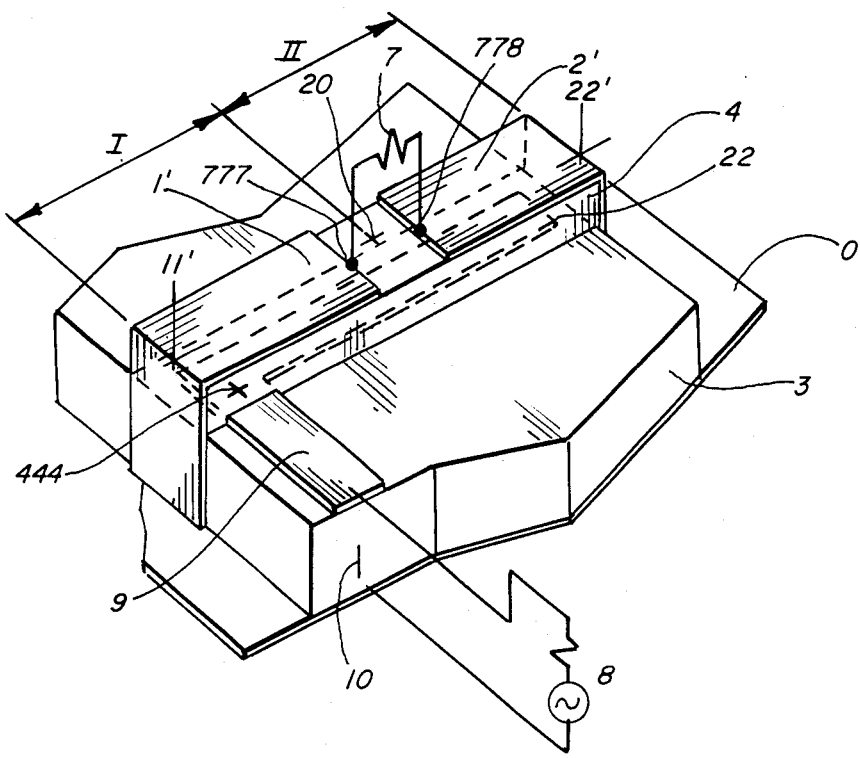
FIG. 1 Perspective view of the fundamental embodiment of the invention employing short circuits as reflective elements.
Figure 2:
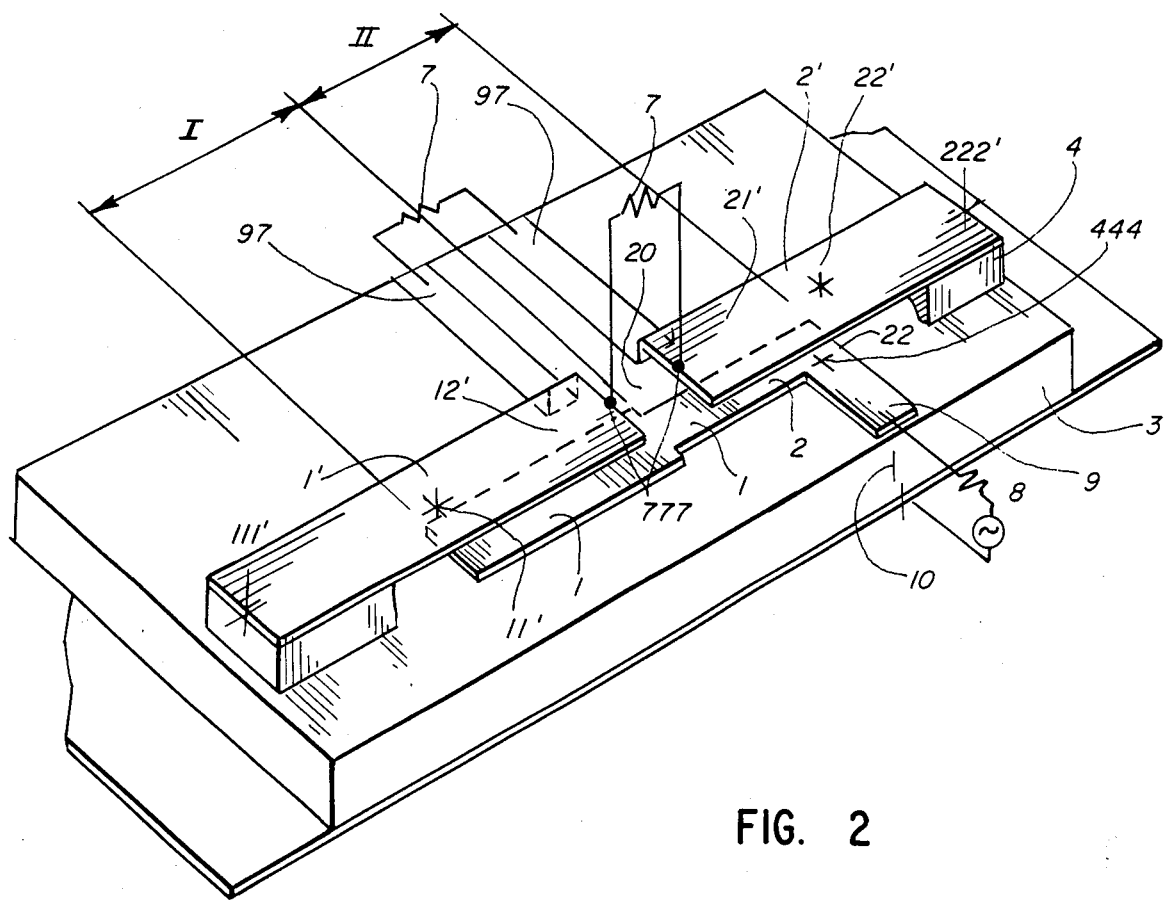
FIG. 2 The balun of invention employing quarter wavelength strip conductive means as reflective elements.

The balun shown in FIG. 1 consists of two second-order reactance sections I and II of electrical lengths equal to about a quarter of the wavelength of a radio-frequency signal. Each section I, II comprises two microstrip-like wave guides, the upper and lower one, whereof one, the lower one, is placed on the top side of a substrate metallized structure 3. The second guide, the upper one, placed above the first one, is separated therefrom by the material volume of the upper layered substrate 4. A pair of guides, one for each section, is the input pair. For example, it is the pair of lower guides 1, 2 placed on the top side of the lower substrate 3. The guides being the input pair are connected with each other directly with the opposite internal ends. The external end of one of the said guides 11 is connected to the input port 10 through the intermediary of the transmission line 9 of the characteristic impedance $Z_o$, while the other end 22 is open. The pair of the remaining guides 1′, 2′, being the output pair, forms with the opposite internal ends thereof 12′, 21′ the balanced terminals 777-778 of the output port 20. The balun design is realised alternatively depending on the selected method of terminating the ends 11′, 22′ of the pair of output guides and the end 22 of the pair of input guides, whereby there are, in general, the opposite phase terminations like, O for example, short-circuit and opening to the ground. For example, as in FIG. 1, the external ends 11′, 22′ of the pair of output guides are both for direct current and for RF signal directly are short-circuited to the ground, O while the end 22 of the pair of input guides, the opposite to the input port 10 is open. In another example, as in FIG. 2, the external ends 11′, 22′ of the pair of output guides are short-circuited to the ground only for RF signal through the intermediary of quarter-wave segments of lines open at the ends at points 111′, 222′.

Figure 3:
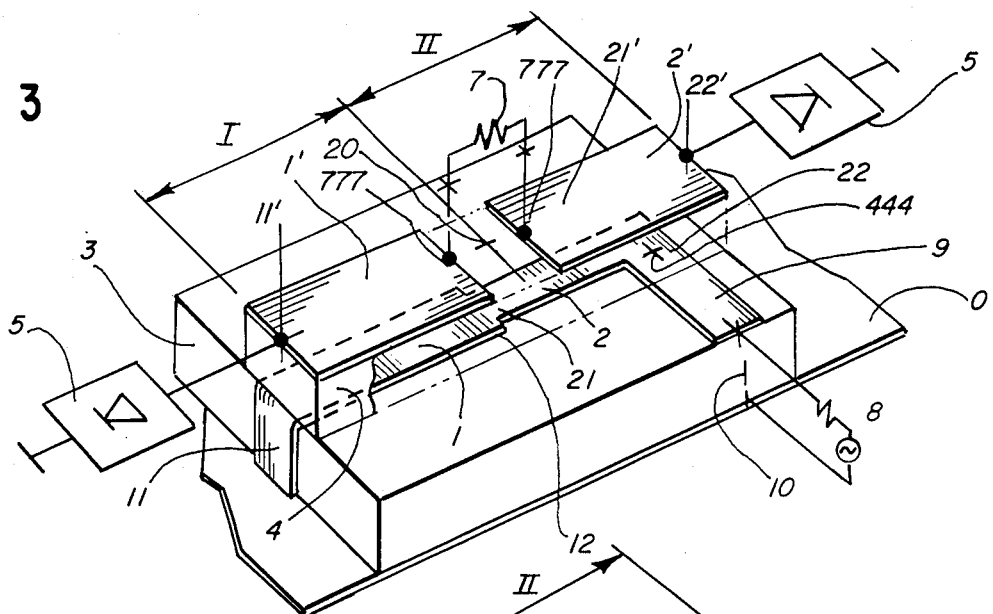
FIG. 3 The balun of invention where reflective elements are established by electronically controlled devices.

Additional strip conductive means 97 of a balanced loading line are provided for those applications where the external balanced load is placed outside of the region occupied by the balun. In still another example, as in FIG. 3, the external ends 11′, 22′ of the pair of output guides are short-circuited to the ground O for RF signal through the intermediary of sufficiently large capacitances 5. In the above-discussed examples the end 22 of the pair of input waveguides, opposite to the end 11 connected with the input port 10, is open for RF signal.

Figure 3A:
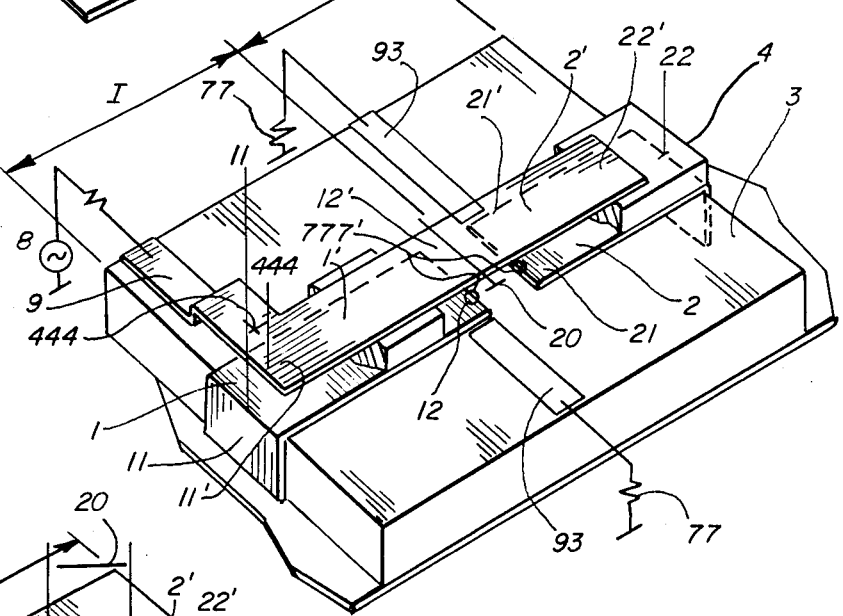
FIG. 3a The balun serving operation of 180° power devider within balanced output lines short circuited and placed on a top side of the lower substrate.

FIG. 3a shows another embodiment for loading with a pair of unbalanced loads 77 connected to balanced output port 20 by strip conductive means 93, of two unbalanced microstrip guides placed outside a region occupied by the balun, wherein a length of said means is as short as possible e.g. a length can be allowed to be preferably close to zero for a pair of loads 77 connected directly to the balanced output terminals 777. Said pair of unbalanced loads can be established for example by a pair of microwave power transistors in push-pull operation. It is a very suitable application of the balun due to its ability of broadband output matching, providing for as low of impedances as several ohm without essential troubles. The figure shows another feature of the balun concerning the ability of an arbitrary choice of output guides 1 and 2 from among both lower and upper guides in each section I, II. The pair of input guides is placed on a topside of the upper substrate 4 and thus an input terminal 444, also placed on the topside layer of upper substrate, is connected to the input unbalanced port 10 by means of stepped unbalanced input line 9. The output guides are placed on the topside of said lower substrate 3 and thus are very suitable for using a pair of unbalanced loads 77 directly implanted in the lower substrate volume as closely to balanced output terminals 777 as possible.

Figure 3B:
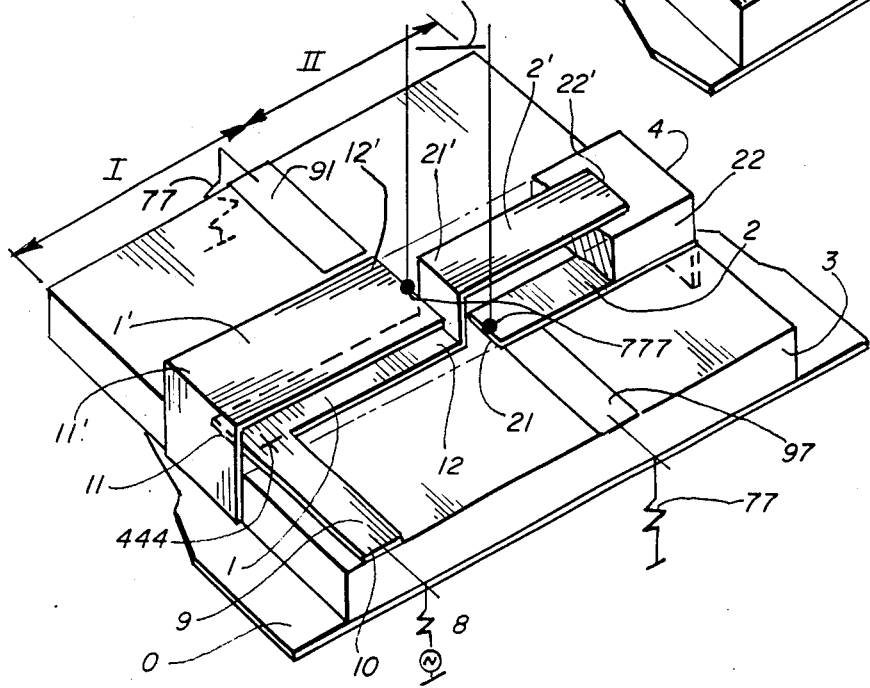
FIG. 3b The balun as a 180° power divider within balanced output lines short circuited but chosen in a different way in respective sections.

To complete demonstration of the arbitrary choice of output guides, FIG. 3b shows that the choice can be made in each section independently and in different way. One of the output guides 1 of one section I is placed on a topside of the lower substrate 3 while another one output guide 2′ is placed on a topside of the upper substrate. The balun is devoted for loading with a pair of unbalanced loads 77 connected to unbalanced output port 20 by strip conductive means 91 placed on a top side of lower substrate 3.

In FIG. 4, the balun provides a switching operation in a more complex system. Two reflective elements 50, 60 terminating output guides 1′ and 2′ at both external ends of the balun 11′ and 22′ respectively are established by two semiconductor junctions directly implanted in lower substrates volume 3 as closely to both external ends as possible. Pin diodes can be employed as either of the reflective elements 50, 60 for switching or attenuation purposes. Negative resistance diodes as both elements 50, 60 can be employed here for oscillator design combining signal power generated by a pair of active devices.

FIG. 4a in another application, the reflective elements 50, 60 can be replaced by attached lumped devices 51, 61 connected to said output guides 1′, 2′ as closely to external ends 11′ and 22′ respectively as possible, or by the use of intermediary conductive means 86, 96.

FIG. 4b shows the reflective elements terminating both output guides 1′ and 2′ established by electronically controlled devices 52, 53 with circuitry 85 at one external end 11′ and elements 62, 63 with circuitry 95 at another external end 22′. They are complex reflective elements with their frequency responses profiled.

Figure 5:
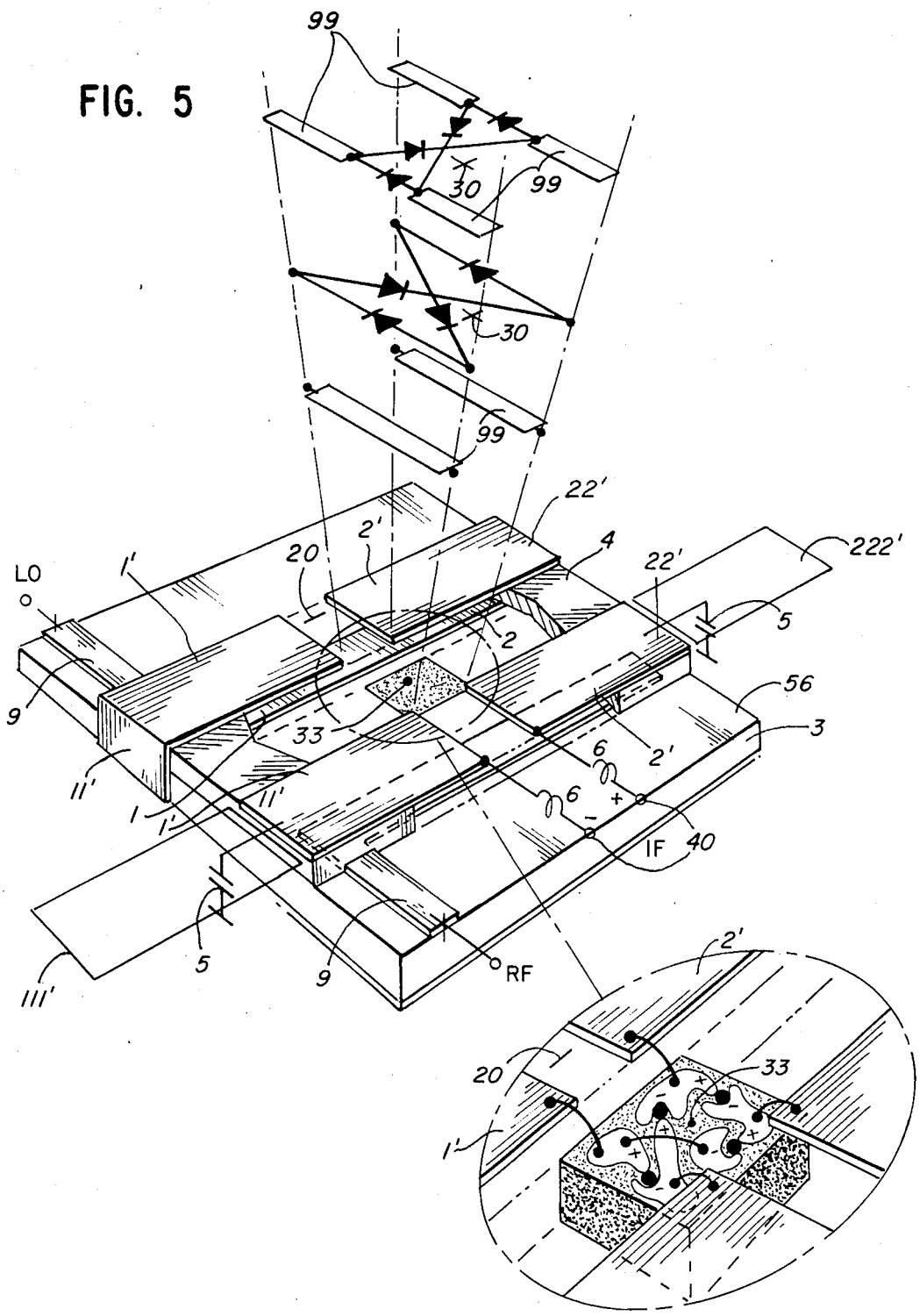
FIG. 5 Double balance mixer design.

The example of application of the balun for a double-balanced mixer design is presented in FIG. 5. The mixer consists of two baluns connected with each other with pairs of balanced terminals of outputs 20 and 20 through the intermediary of a quad-array of diodes 30 in such a way that each of baluns is connected to the different one of the two diagonals of the ring of diodes forming the quad 30. One of the baluns serves for supplying the RF power from the unbalanced input 101 to the quad, and the other one—for supplying the RF power from the unbalanced input 102. The ends of pairs of input guides 22 and 22 of both baluns, opposite to the inputs, are open to the ground O. The external ends of pairs of output guides 11′, 22′ of both baluns are, on the other hand, short-circuited to the ground O for RF signal, whereby for one of them the ends are short-circuited galvanically, and for the other one the said ends are short-circuited through the intermediary of sufficiently large capacitances 5 or quarter-wave segments of transmission lines open on ends 111′, 222′ in order to collect the intermediate frequency (IF) product from the quad of diodes to the balanced IF output port 40. The IF output port is connected to terminals of the output 20 of the signal balun through the intermediary of in-series inductances 6 which together with capacitances 5 or quarter-wave segments of open waveguides form low-pass filters 56. The said filters determine the intermediate-frequency broadband properties of the mixer. The limit is considerably weaker for the example of the mixer in FIG. 6.

Figure 6:
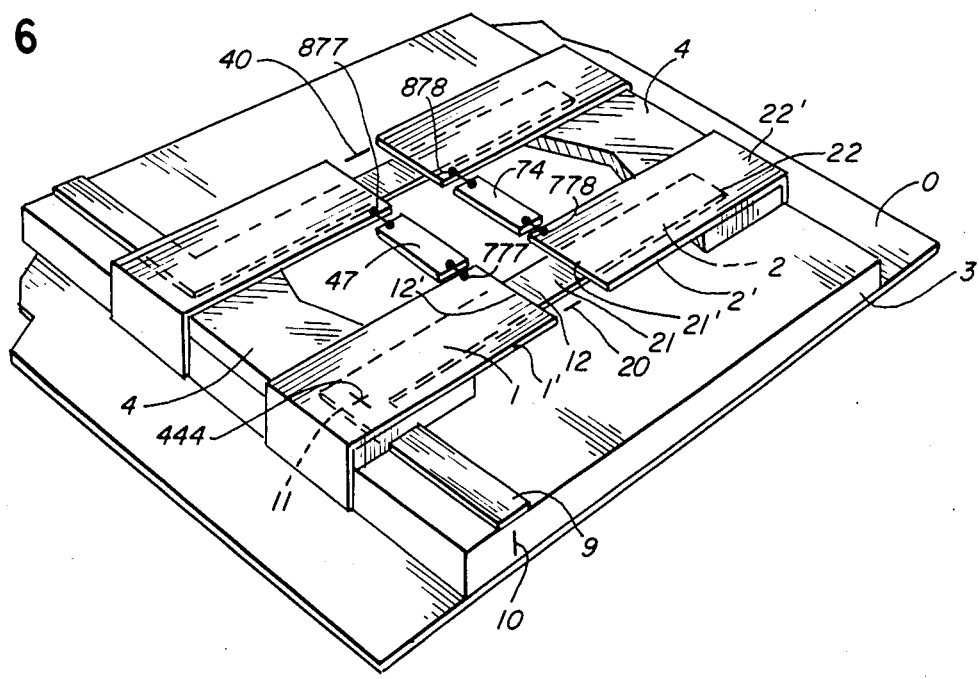
FIG. 6 Two baluns in parallel test arrangement.

FIG. 6 shows a pair of baluns using the invention in parallel arrangement for test purposes. The baluns are interconnected one to another with their balanced output ports 20, 40 to their terminals 777, 778 and 877, 878 respectively, by short strip conductive means 47, 74. Both baluns are used in a fundamental form according to FIG. 1, with their input lines open at the secondary end 22 of a section. It is the structure recommended for a double balanced mixer where the conductive means 47, 74 are replaced by electronically controlled devices, as shown in FIGS. 6a, 6b and 6c.

Figure 6A:
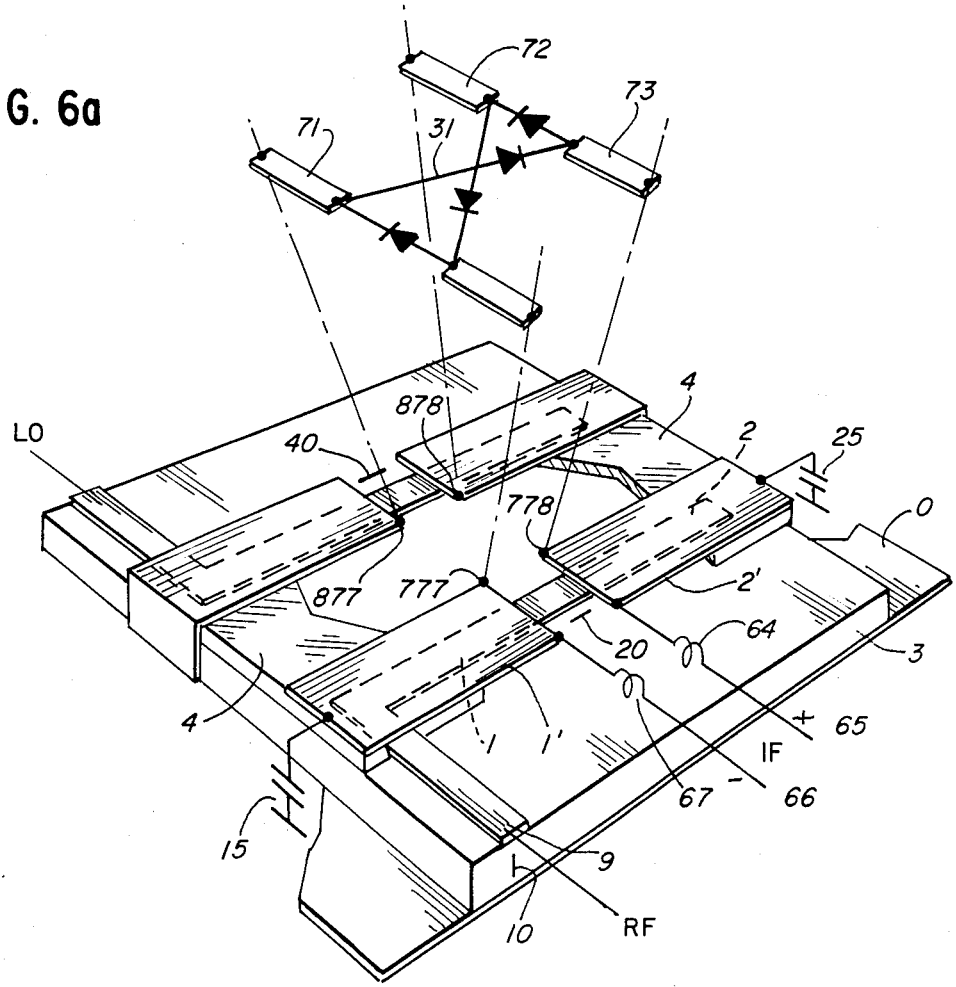
FIG. 6a Double balanced mixer with twisted semiconductor ring interconnecting balanced output ports within bypass elements added for maintaining mixer operation.

FIG. 6a presents a double balanced mixer with twisted ring of semiconductor diodes 31 interconnecting output ports 20, 40 of both baluns by intermediary of short conductive means 71, 72, 73, 74. One of the baluns is fed by local oscillator LO pumping the diode quad 31 with a heterodyne signal, while the other one is fed by RF signal processed by the mixer. The mixer application obviously requires bypass elements 15, 25 short circuiting the RF signal to the ground and filter elements 64, 67 isolating the IF terminals 65, 66 from the RF signal. They are routed elements found in any mixer.

Figure 6B:
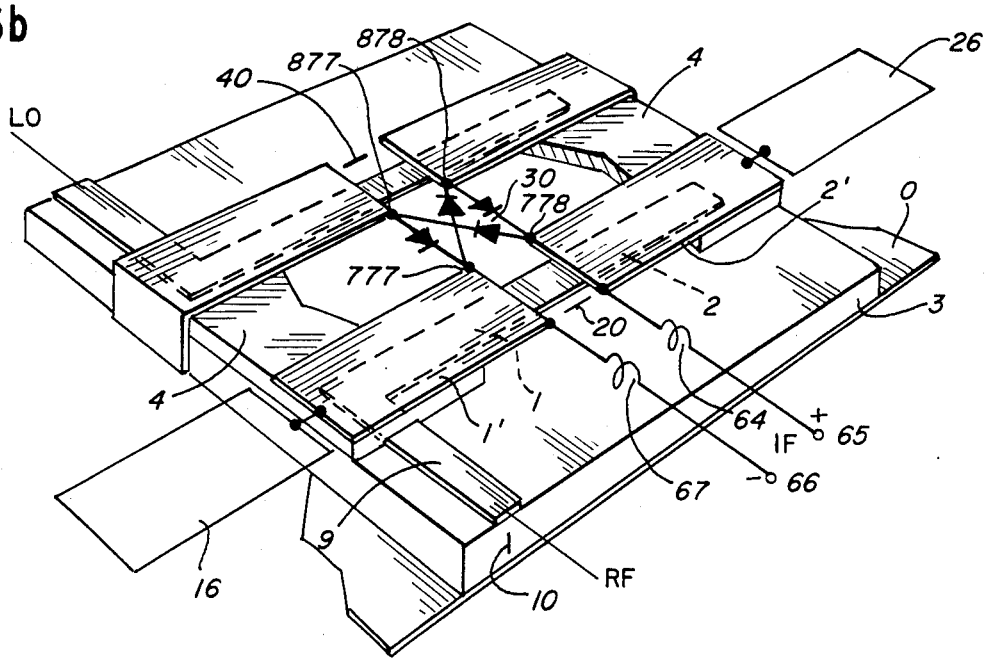
FIG. 6b Double balanced mixer where the conductive means of FIG. 6a are reduced to zero and within alternative use of open ended strip reflective elements.

FIG. 6b presents a very important feature of the mixer; both balanced output ports are closely placed one to another so that short conductive means 71, 72, 73, 74 from the FIG. 6a can be simply reduced in length to zero, and the diode quad 30 connected to output ports 20, 40 directly. This feature results in a very small area being occupied by the mixer with respect to the designs with two baluns crossed over seen in other applications. The two baluns being placed one along the other in parallel is acceptable due to very noneffective coupling between them over a free space, because the adjacent sections of both baluns are short circuited to the ground at the same adjacent ends of sections. FIG. 6b presents bypass elements 16, 26 in the form of open ended strip conductive means.

Figure 6C:
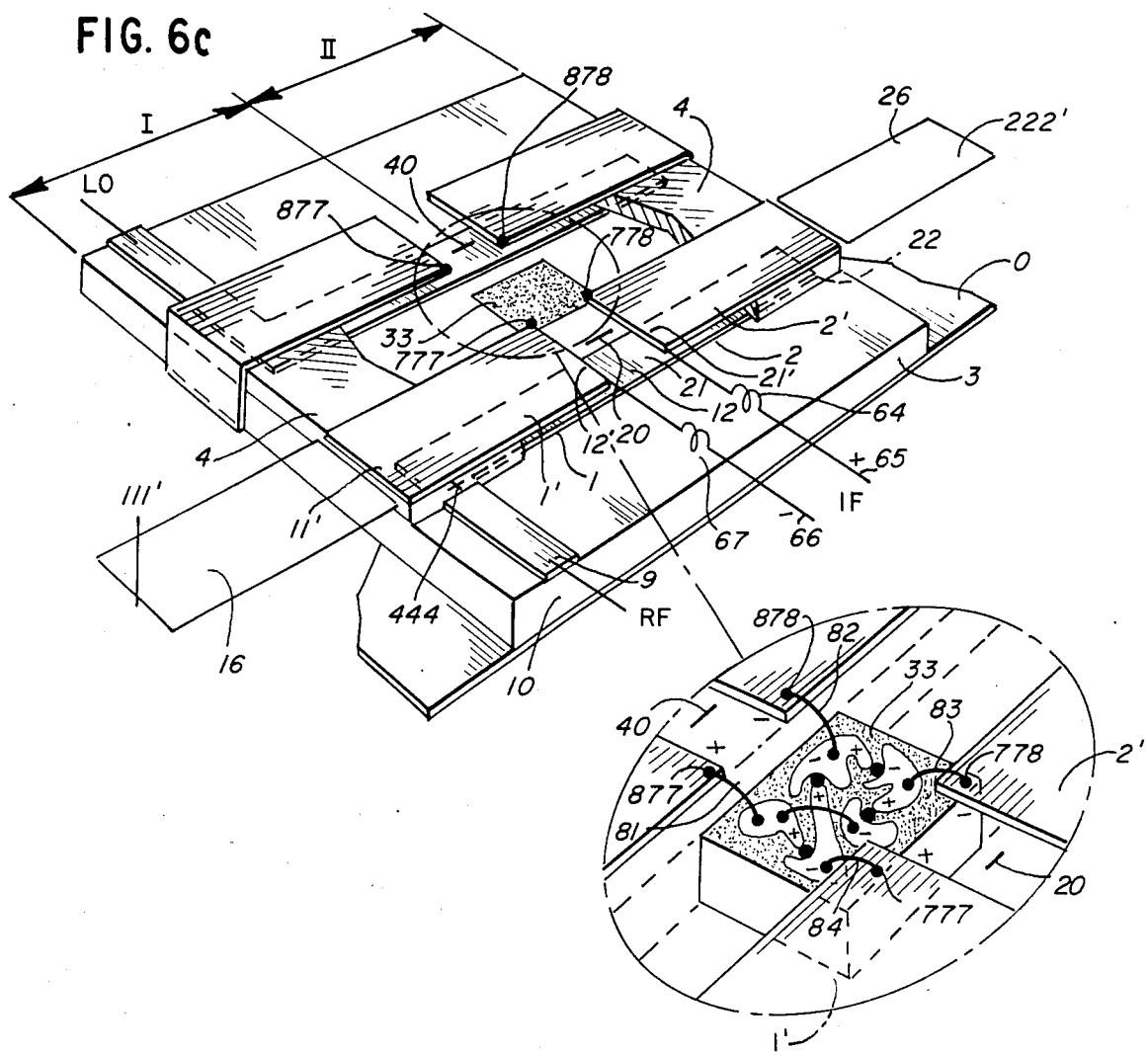
FIG. 6c The preferred embodiment of the balun in a double balanced mixer with a diode quad directly implanted in the lower substrate volume.

FIG. 6c presents a double balanced mixer. The structure of the mixer is constructed according to previously shown FIGS. 1, 2 and 6b with the difference in diode quad 33 used. The twisted ring mixing diodes 33 can be simply implanted in lower substrate volume 3, close to both balanced output ports 20, 40, of both baluns. Diode quad 33 is shortly connected to output terminals 777, 778 and 877, 878 by means of wire bonds 81, 82, 83, 84 (see insert). The design requires use of semi-insulating crystal material for a lower substrate 3, for example SI GaAs, and using of some dielectric layer for upper substrate 4. The design is very suitable for monolithic technology and its area saving feature is in great premium. High available isolations of RF, LO and IF ports and a decade bandwidth result.

The presented examples do not exhaust the advantageous possibilities of forming other systems of mixers with the use of the balun according to the invention but they expose its applicational flexibility due both to its topological characteristics and the mutually complementary realisations. The balun operation consists in supplying full RF power from an unbalanced input port having input impedance 8 ($Z_o$) to a balanced output port having output impedance 7 close to $R_L$ or to a pair of unbalanced output ports having output impedance close to $R_L/2$, with equal amplitudes and the opposite phases at a possibly wide transmission band and possibly the best matching of input- and output ports.

For example, the balun design is manufactured with the use of the thin-film technology used in microwave hybrid integrated circuits on the alumina substrate ($Al_2O_3$) 3 of the thickness of from 0.50 up to 1.50 mm. The dielectric layer of the upper substrate 4 separating the balun wave guides is made of a dielectric material which dielectric constant is close to the dielectric constant of the lower substrate 3 and the thickness equal to about 1/5 of the thickness of the lower substrate 3. The thickness of the upper substrate 4 is dependent on the required compensation ratio of the dispersion properties of wave guides.

In another design the balun is manufactured with the use of the monolithic technology proper to the monolithic integrated circuits on the substrate 3 of semi-insulating gallium arsenside GaAs of the thickness smaller than 0.50 mm. The dielectric layer of the upper substrate 4 separating the wave guides is made of silicon nitride $Si_3N_4$ of the thickness equal to about 1/5 of the thickness of the lower substrate 3. Such a realisation of the balun is especially convenient for microwave bands of about 8 GHz.

The cross-section dimensions, in general different for each section of wave guides and different for particular segments of each section, and dependent on the desired broad band properties for typically assumed impedances as e.g. 50 Ohm input and 100 Ohm load, show full feasibility of the design of the balun and considerable tolerance thereof to inaccuracy of technological processing. Noteworthy is the fact that feasibility of the balun design has no limitations in the selection of the cross-section dimensions of the sections which have appeared in other designs of baluns, whereby there is a certain degree of freedom in the selection of both the material and the thickness of the upper substrate, which enables achieving the desirable compensation of expected phase velocity ratio for even- and odd-mode excited waves up to full compensation thereof inclusive. In the consequence, the design of the balun gains a good technological feasibility, due to elimination of operations correcting the velocity ratio.

The balun design according to the invention is applicable especially as a 180° power divider, and in co-operation with a second balun and a quad of semiconductor diodes—as a double-balanced mixer or modulator. The above applications do not exhaust all possibilities created by the balun according to the invention. They have a very advantageous characteristic in the form of broadband properties, which can exceed even three octaves. Besides, noteworthy is the advantageous layered structure of the balun design with maintenance of the undisturbed bottom metallized ground plane suitable both for thin-film technology based on alumina substrate ($Al_2O_3$), as well as for the monolithic technology utilizing semi-insulating gallium arsenide GaAs and a $Si_3N_4$ layer. The monolithic realisation creates also the possibility of producing by selective epitaxy or ion implantation the semiconductor junctions directly in the substrate material of the balun used, for example, for a monolithic mixer design.

The balun design according to the invention is appropriated for utilization within the frequency range of 1–18 GHz, i.e. within the range characteristic for wide applications of microstrip lines. Within the range of frequencies lower from the S band it is inferior to lumped baluns utilizing ferrite cores, whereas for the frequencies above 18 GHz—to fin-lines and slot-line baluns superior to it in respect of easy combining with waveguide technique.

We claim:

1. A microwave balun using transverse electromagnetic coupled microstrip wave guides comprising:
   a continuous ground conductive plane;
   two sections of two microstrip broadside coupled wave guides establishing four wave guides, the two guides coupled and unbalanced in each section, wherewith each of said sections having an electrical length equal to about one-fourth wavelength of a radio frequency (RF) signal operating in the balun;

each of said two sections collinearly extending toward another;

each of said two sections having two ends of sections establishing one primary and one secondary end of section;

one said primary end of one section directly juxtaposed to another primary end of another section and both said primary ends of both sections defining a pair of internal ends of sections in the middle of the balun;

one secondary end of one section positioned non-adjacent to the other secondary end of the other section and both said secondary ends defining a pair of external ends of the balun;

a balanced output port establishing a pair of output terminals at said directly juxtaposed internal ends of sections in the middle of the balun;

an unbalanced input terminal placed at one of the pair of said external ends of the balun;

an unbalanced input guide establishing a single conductive strip posed outside a region occupied by said sections of microstrip broadside coupled wave guides and having nominal input impedance value;

an unbalanced input port established by said unbalanced input guide and said contiguous ground conductive plane, wherewith said unbalanced input guide interconnecting said unbalanced input terminal to said unbalanced input port;

three reflective elements each element terminating and connecting a respective one of said coupled wave guides to said contiguous ground conductive plane at each of said external ends of the balun, where said unbalanced input terminal terminates a wave guide at the remaining external end not terminated by any of said three reflective elements, where each reflective element includes a phase of a reflection coefficient related to the nominal input impedance value of said unbalanced input guide; and a first and a second reflective element characterized for a radio frequency signal operating in the balun by respective phases of reflection coefficients necessarily of equal values and of a value adapted to be arbitrarily chosen;

and a third reflective element characterized for a radio frequency signal operating in the balun by a phase of a reflection coefficient of a value necessarily opposite to the value of phases of reflection coefficients of said first and said second reflective elements within preferably fine accuracy;

a first layered substrate having a first and a second side thereof placed on said contiguous ground conductive plane and defining a lower substrate and a first side thereof placed in touch with said contiguous ground conductive plane defining a bottomside of the lower substrate and a second side thereof opposite to first side thereof defining a topside of the lower substrate;

a second layered substrate having a first and a second side thereof placed on said topside of the lower substrate and defining an upper substrate and a first side thereof placed on said topside of the lower substrate defining a bottomside of the upper substrate and thus a first side thereof establishing an interface plane between said topside of the lower substrate and said bottomside of the upper substrate and a second side thereof opposite to first side thereof defining a topside of the upper substrate; where each of said sections of two microstrip broadside coupled wave guides are established by two strip conductive means comprises a lower and an upper guide and coupled therebetween such that;

each of said sections of two microstrip broadside coupled wave guides placed thereabove said contiguous ground conductive plane; and thus said lower guide in each section placed on said topside of the lower substrate and thus posed on said interface plane and thus separated from said contiguous ground conductive plane by the volume of said lower substrate; and said upper guide in each section placed on said topside of the upper substrate and placed thereabove said lower guide and thus separated from said lower guide by the volume of said upper substrate; where said upper guide in each section has a volume of upper guide in a spaced covered between strip conductive means of said upper guide and said contiguous ground conductive plane, and said upper guide guiding most of the energy of RF signal wave covered in said volume of upper guide and partially in the free space thereabove and therearound said upper guide and in consequence said upper guide guiding the RF signal wave in the essentially and transversally inhomogeneous medium of propagation, and thus said upper guide serving one single microstrip guide with respect to said contiguous ground conductive plane; and said lower guide being inserted inside said volume of said upper guide in such a way that said lower guide serving another single but inverted microstrip guide with respect to said upper guide, and serving said single inverted microstrip guide as much effectively as said lower guide being closer to said upper guide than to said contiguous ground conductive plane; and thus each of said lower guide and said upper guide in one section being essentially characterized by a diversity of distances of said lower and upper guides from said contiguous ground conductive plane and each of said lower guide and said upper guide in one section serving two unbalanced broadside coupled wave guides and all four microstrip broadside coupled wave guides from both sections comprising:

a first pair of said microstrip broadside coupled wave guides comprising a first and a second wave guide each guide arbitrarily chosen from both said lower and said upper guide in one section and thus said first wave guide chosen from one section and said second wave guide chosen from another section and both first and second wave guides defining a pair of output guides;

a second pair of said microstrip broadside coupled wave guides comprising a third and a fourth wave guide each guide from each section and different from said first wave guide and different from said second wave guide and both said third and said fourth guides defining a pair of input guides; where said first and said second wave guides establishing said two output terminals of said balanced output port at said internal ends of sections in the middle of the balun;

said first and said second wave guides terminated at said external ends of the balun by said first and said second reflective elements respectively;

said third and fourth wave guides interconnected one to the other at said internal ends of sections in the middle of the balun by conductive means as short as possible;

said third wave guide terminated at one of said external ends of the balun by said third reflective elements;

said fourth wave guide terminated at another one of said external ends of the balun by said unbalanced input terminal connected to said unbalanced input guide as closely to the external end of the balun as possible; where said phases of reflection coefficients of said first and said second reflective elements, and material constants of said lower substrate, said upper substrate, the thicknesses thereof, the widths of all conductive strips of all said microstrip coupled wave guides, and the width of said unbalanced input guide have values dependent upon the required impedance of said unbalanced input port, and upon impedance of said balanced output port, and upon the required bandwidth of the balun transmission properties; and thus the balun having a layout, one side fixed to said contiguous ground conductive plane from said bottom-side of said lower substrate and other side open from said topside of said upper substrate.

2. A microwave balun according to claim 1, wherein said balanced output port is loaded with a balanced load connected to said output terminals by two conductive means placed outside a region occupied by said sections of microstrip broadside coupled wave guides, wherein a length of said means is as short as possible.

3. A microwave balun according to claim 1, wherein said balanced output port is loaded with a pair of unbalanced loads connected to said contiguous ground conductive plane as closely to the terminals as possible and connected to said output terminals by two conductive means placed outside a region occupied by said sections of microstrip broadside coupled wave guides, wherein a length of said means is as small as possible.

4. A microwave balun according to claim 1, wherein said balanced output port is loaded with an assembly of electronically controlled elements connected to said output terminals by two conductive means placed outside a region occupied by said sections of microstrip broadside coupled wave guide, wherein a length of said means is as small as possible.

5. A microwave balun according to claim 4, wherein said assembly of electronically controlled elements is established by semiconductor junctions directly implanted in said lower substrate as closely to said output terminals as possible.

6. A microwave balun according to claim 1, wherein said balanced output port is loaded with said balanced output port of another balun of similar construction and connected together by conductive means, wherein a length of said means is as small as possible.

7. A microwave balun according to claim 1, wherein said conductive means are established by electronically controlled elements.

8. A microwave balun according to claim 1, wherein said first and said second reflective elements are established by two electronically controlled circuits posed outside a region occupied by said sections of microstrip broadside coupled wave guides and each of said circuits connected to one of said output guides at one of said external ends of the balun.

9. A microwave balun according to claim 1, wherein said first and said second reflective elements are established by two semiconductor junctions directly implanted in said lower substrate as closely to said external ends of the balun as possible and each of junctions connected one of said output guides at one of said external ends of the balun by conductive means, wherein lengths of said means are as small as possible.

* * * * *